United States Patent [19]

Merrem

[11] Patent Number: 5,399,463

[45] Date of Patent: Mar. 21, 1995

[54] PROCESS OF PHOTOPATTERNING A SUBSTRATE WITH A POSITIVE PHOTORESIST COMPOSITION CONTAINING A DIAZOQUINONE PHOTOSENSITIZER

[75] Inventor: Hans J. Merrem, Seeheim, Germany

[73] Assignee: Ciba-Geigy Corporation, Ardsley, N.Y.

[21] Appl. No.: 227,831

[22] Filed: Apr. 14, 1994

Related U.S. Application Data

[60] Division of Ser. No. 692,811, Apr. 25, 1991, Pat. No. 5,334,481, which is a continuation of Ser. No. 609,031, Aug. 14, 1990, abandoned, which is a continuation of Ser. No. 352,718, May 12, 1989, abandoned, which is a continuation of Ser. No. 104,930, Oct. 6, 1987, abandoned, which is a continuation-in-part of Ser. No. 858,146, May 1, 1986, abandoned.

[30] Foreign Application Priority Data

May 2, 1985 [DE] Germany ............ 35 15 693.7

[51] Int. Cl.$^6$ .............................................. G03C 5/00
[52] U.S. Cl. .................................................... 430/326
[58] Field of Search ............... 430/326, 325, 191, 165, 430/192

[56] References Cited

U.S. PATENT DOCUMENTS

| | | | |
|---|---|---|---|
| 4,362,809 | 12/1982 | Chen et al. | 430/312 |
| 4,370,405 | 1/1983 | O'Toole et al. | 430/166 |
| 4,376,162 | 3/1983 | Kawata et al. | 430/510 |
| 4,414,314 | 11/1983 | Kaplan et al. | 430/166 |
| 4,575,480 | 3/1986 | Kotani et al. | 430/192 |
| 4,618,565 | 10/1986 | White et al. | 430/311 |
| 4,626,492 | 12/1986 | Eilbeck | 430/191 |
| 4,910,122 | 3/1990 | Arnold et al. | 430/313 |

FOREIGN PATENT DOCUMENTS

| | | |
|---|---|---|
| 159428 | 10/1985 | European Pat. Off. . |
| 1039475 | 7/1963 | United Kingdom . |
| 1041463 | 9/1966 | United Kingdom . |

OTHER PUBLICATIONS

Elliott, D. J., Integrated Circuit Fabrication Technology, 1982, pp. 186–188.
Japan Patent Abstracts, 9, No. 86, p. 349 (1985).
IEEE Transactions on Electron Devices, ED-28, No. 11, 1405–1410 (1981).
Cernigliaro, G. J. et al., "Dissolution Rate . . . Positive Photoresists", SPIE, vol. 1086, Advances in Resist Technology and Processing VI (1989), pp. 106–116.
Renschler, C. L. et al., J. Electrochem. Soc., vol. 136, No. 1, Jan. 1989, pp. 281–283.

*Primary Examiner*—Marion E. McCamish
*Assistant Examiner*—Laura Weiner
*Attorney, Agent, or Firm*—William A. Teoli, Jr.

[57] ABSTRACT

Addition of compounds of formula I

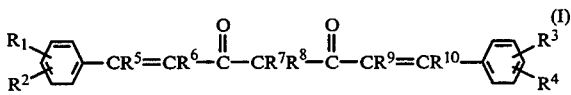

in which $R^1$ to $R^4$ are each hydroxyl or $C_{1-6}$-alkoxy and $R^5$ to $R^{10}$ are each hydrogen or $C_{1-6}$-alkyl, to positive photoresist compositions based on a diazoquinone/novolak resin effectively suppresses stray radiation and halation effects in corresponding photoresist coatings, in particular if these coatings have been applied to highly reflective substrates.

4 Claims, No Drawings

PROCESS OF PHOTOPATTERNING A SUBSTRATE WITH A POSITIVE PHOTORESIST COMPOSITION CONTAINING A DIAZOQUINONE PHOTOSENSITIZER

This is a divisional of Ser. No.07/692,811, filed Apr. 25, 1991, now U.S. Pat. No. 5,334,481, which is a continuation of Ser. No. 07/609,031, filed Aug. 14, 1990, now abandoned which is a continuation of Ser. No. 07/352,718, filed May 12, 1989, now abandoned which is a continuation of Ser. No. 07/104,930, filed Oct. 6, 1987, now abandoned which is a continuation-in-part of Ser. No. 06/858,146, filed May 1, 1986, now abandoned.

BACKGROUND OF THE INVENTION

This invention relates to positive photoresist compositions which contain radiation-absorbing compounds as additives for suppressing stray radiation or halation effects.

Photoresists serve as versatile high-grade process chemicals in the manufacture of electric circuits and electronic components and are used in particular in the structuring of conductor and semiconductor substrates by photolithographic techniques.

In the process sequences customarily used, the substrates are coated with the photoresist composition. The photoresist layer is then exposed through an image original to high-energy radiation, generally ultraviolet radiation, and thereafter developed.

In the case of positive photoresists, those areas of the layer which, in correspondence with the image pattern of the original, are exposed to radiation become more soluble in a developer through the action of the radiation. In the developing step, the exposed parts of the layer are removed, leaving behind the unexposed and thus insoluble parts as a relief structure which represents a positive image of the original on the substrate surface.

In the case of negative photoresists the effect of the radiation is to crosslink the layer in the exposed regions which reduces the solubility in a corresponding developer. In the developing step, the unirradiated areas of the layer are removed. A negative image of the original remains behind as a relief structure on the substrate.

The ever advancing miniaturization in semiconductor technology and microelectronics places ever higher demands on the image structures to be represented by means of photoresist materials. This applies particularly to the resolution and edge steepness of the photoresist relief structures, but also to adhesion, mechanical and chemical stability, dimensional fidelity, resistance at elevated temperatures and to other factors which can play a part in the subsequent process steps.

Positive photoresists are today still preferred in the production of fine and very fine structures, since they have the better properties, in particular with respect to resolving power. The positive photoresist compositions customarily used today essentially contain, dissolved in an organic solvent, phenol-formaldehyde condensates of the novolak resin type and compounds of the type of o-diazoquinones as light-sensitive components. Such compositions can be developed in aqueous alkaline developing baths.

However, state of the art positive photoresists are still capable of improvement. It is generally a known problem in photoresist technology that in applications to substrates which have a surface of high reflective power, which is generally the case with semiconductor materials and metals such as, for example, silicon, aluminum, copper, chrome, etc., the resolving power of the photoresist is appreciably reduced by reflections occurring at the surface of the substrate. As a result of irregular scattering of the incident light at the substrate surface, stray light penetrates into areas of the resist layer which, according to the image pattern of the original are not supposed to be exposed to any radiation. Such scattering and halation effects give rise to relief structures having reduced edge crispness and steepness after development. Fine and very fine structures, e.g., as needed in microelectronics, are obtainable only with limited fidelity of reproduction, as a consequence of these effects.

To overcome such problems it is known, in particular from negative photoresist technology, to add to the resist compositions radiation-absorbing dyes to reduce undesirable exposure effects. The demands placed on such dyes are, for example, high absorption power within the wavelength range of the exposure apparatus, compatibility with the photoresist composition, e.g., in particular a sufficient solubility therein, and stability under the conditions of the process sequences.

Of the dyes used hitherto for such purposes, aminoazobenzene derivatives, as proposed for example in Japanese Patent 51 (76) 37,562 or U.S. Pat. No. 4,268,603 as additives to negative photoresists based on cyclized rubber, and bisazido radiation crosslinkers have the most favorable absorption properties. These substances, however, have the disadvantage of being only relatively sparingly soluble in photoresists and, moreover, subliming out of the resist layer to an appreciable degree at elevated temperatures up to about 100° C. The latter are customarily employed in the process step of predrying or prebaking the applied coating. More favorable in this respect are the aminoazobenzene derivatives of German Offenlegungsschrift 3,324,795 (U.S. application Ser. No. 628,881 of Jul. 9, 1984), which are still stable at temperatures around 120° C.

It has been found, however, that despite their favorable absorption properties, the use of the negative photoresist technology dyes in positive photoresists does not lead to the desired success. The process sequences for structuring semiconductor substrates by means of positive photoresists frequently give rise to temperatures of 150° to about 200° C., for example in the customary heat treatment steps of prebaking and postbaking which are necessary for increasing the adhesion of the resist layer to the substrate and for increasing its stability. Moreover, such thermal stresses occur in the course of plasma etching and ion implantation processes. Even the most heat-stable dyes known at these temperatures sublime out of the resist layer. As a result, the resist layer loses the desired absorption properties. This then has a drastic negative effect on the resolving power and edge steepness of the resist image to be produced. At the same time the sublimed dye causes extremely undesirable contamination in processing equipment.

SUMMARY OF THE INVENTION

It is therefore an object of this invention to provide dyes having favorable absorption properties, which are compatible with positive photoresists and, moreover, which do not sublime out of the resist layer even at temperatures up to 200° C.

Upon further study of the specification and appended claims, further objects and advantages of this invention will become apparent to those skilled in the art.

These objects have been achieved in an outstanding manner by utilizing compounds of formula I

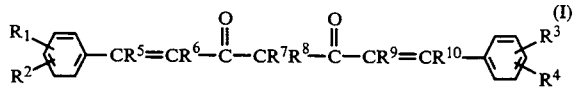

in which $R_1$ to $R_4$ are independently each hydroxyl or $C_{1-6}$-alkoxy and $R^5$ to $R^{10}$ are independently each hydrogen or $C_{1-6}$-alkyl.

The invention thus provides positive photoresist compositions based on a diazoquinone/novolak resin and containing at least one compound of formula I. The invention also provides the use of compounds of formula I for suppressing stray radiation and halation effects in positive photoresist coatings.

DETAILED DISCUSSION

The compounds of the formula I are terminally aromatically substituted heptadienediones in which the aromatic substituents carry hydroxyl or alkoxy radicals.

The radicals $R^1$, $R^2$, $R^3$ and $R^4$ can independently of one another be hydroxyl or alkoxy of 1 to 6 C atoms and occupy the free ring positions on the phenyl rings in any desired manner. Preferably one of the radicals in each case always occupies the para-position and the other radical the meta-position on the phenyl rings. Preference is given to those compounds in which the two phenyl rings are each substituted with a hydroxyl and a methoxy group.

The substituents $R^5$, $R^6$, $R^7$, $R^8$, $R^9$ and $R^{10}$ in the heptadienedione structural unit independently of one another can each be hydrogen or alkyl of 1 to 6 C atoms. Preference is given to those compounds in which the radicals $R^5$ to $R^{10}$ are hydrogen and/or methyl.

Compounds useful according to the invention include for example:

1,7-bis-(3-methoxy-4-hydroxyphenyl)-1,6-heptadiene-3,5-dione 1,7-bis-(3-methoxy-4-hydroxyphenyl)-3,3-dimethyl-1,6-heptadiene-3,5-dione 1,7-bis-(3-methoxy-4-hydroxyphenyl)-1,2,6,7-tetramethyl-1,6-heptadiene-3,5-dione 1,7-bis -(3-methoxy-4-hydroxyphenyl) -1,2,3,3,6,7-hexamethyl-1,6-heptadiene-3,5-dione, or 1,7-bis-(3-ethoxy-4-hydroxyphenyl)-1,6-heptadiene-3,5-dione.

The compounds to be used according to this invention are dyes known per se. They are commercially available or can be obtained in a simple manner using known methods of preparative organic chemistry. Particular preference is given to the compound 1,7-bis-(3-methoxy-4-hydroxyphenyl)-1,6-heptadiene-3,5-dione which is also known under the name curcumin.

The compounds of formula I have pronounced absorbing action within the wavelength range of about 350 to 450 nm, in particular within the range of about 400 to 450 nm which is customarily used in exposure units in photoresist technology. Furthermore, these compounds are very readily soluble in positive photoresist compositions based on a diazoquinone/novolak resin. They effect an absorption of the incident light by 65 the composition of above 90% even at low to moderate concentrations, for example within the range of 0.1–10% by weight, based on the solids content of the photoresist composition. These effects are achieved at conventional levels of irradiation commonly employed in the photoresist industry, e.g. 10 to 100 mJ/cm$^2$.μm flux levels.

Furthermore, it was found, surprisingly, that employing the compounds of formula I does not cause a loss in photosensitivity of the photoresist compositions. Such a loss in photosensitivity would require a substantial increase in the minimum exposure energy needed to obtain well-resolved photoresist structures of, e.g., 1 μm dimension.

By adding the compounds of formula I to positive photoresist compositions it is possible to suppress very effectively undesirable stray radiation and halation effects which are a nuisance, in particular in resist layers on highly reflective substrates. A particular advantage of the compounds of formula I is that they are still stable even at temperatures around 200° C. and do not sublime out of the resist layer. The radiation-absorbing action of these dyes in the resist layer thus is fully maintained even after exposure to temperatures of 150°–200° C. The processing equipment is not contaminated by sublimed dye.

The positive photoresist compositions useful in accordance with this invention containing at least one compound of formula I are especially those comprising phenol-formaldehyde condensates of the novolak resin type and light-sensitive o-quinonediazide compounds. They are in particular mixtures of condensation products of formaldehyde with phenols or compounds containing phenolic hydroxyl groups with naphthoquinonediazidesulphonyl derivatives. Such photoresist materials or their essential components have been variously disclosed in the prior art, for example in German Patent 938,233/U.S. Pat. No. 3,106,465 and German Patent 1,195,166/U.S. Pat. No. 3,200,239, German Offenlegungsschrift 3,200,816 and German Patent Application P 33 44 202. Corresponding materials and completed formulations are commercially available from a wide variety of sources.

The formulation of the positive photoresist compositions according to the invention is effected in conventional manner by mixing the components or dissolving them in a suitable solvent, the compounds of formula I to be used according to the invention being added in an amount of 0.1–10% by weight, preferably 1–5% by weight, based on the solids content of the photoresist composition. In similar fashion it is possible to add the appropriate amount of compound(s) of the formula I to previously formulated positive photoresist compositions of the type which are for example already on the market.

The application of the positive photoresist compositions according to the invention is effected in fully conventional manner with the processing equipment customary for this purpose. Even on highly reflective substrates they produce positive photoresist relief structures of very high resolution, edge steepness and fidelity of reproduction.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the preceding text and the following examples, all temperatures are set forth uncorrected in degrees Celsius and all parts and percentages are by weight, unless otherwise indicated.

EXAMPLE 1 a) 3% by weight of curcumin is incorporated in a commercially available positive photoresist composition based on a diazoquinone/novolak resin (Selectilux ® P 100, from E. Merck, Darmstadt).

This photoresist formulation is applied in a 1 μm thick layer to a quartz glass plate by spin coating, and the plate is prebaked at 100° C. for 1 minute to remove the solvent. The resist layer is subsequently heated at 200° C. for 30 minutes. Thereafter, the optical transmission is determined.

It is found to be only 6.5% of the incident light energy at 405 nm and 8.1% at 436 nm. More than 90% of the incident light is thus absorbed.

b) If the photoresist composition according to a) is applied to silicon discs and thereafter treated in the same way, no traces of sublimed dye can be found in the processing apparatus.

By exposing the silicon discs bearing the photoresist layer through a resolution test mask and subsequently developing it in a commercially available aqueous alkaline developer, it is possible to obtain crisp relief structures having a resolution up to 1 μm.

EXAMPLE 2 (COMPARATIVE EXAMPLE)

The commercially available photoresist mentioned in Example 1 has added to it 5% by weight of 4-N-ethyl-N-(2-phenoxyethyl)-aminoazobenzene (a dye in accordance with German Offenlegungsschrift 3,324,795).

On application and treatment in accordance with Example 1a) the optical transmission is found to be 12% at 405 nm and 14.7% and 436 nm.

On application and treatment in accordance with Example 1b) the processing apparatus is found to contain significant discoloration stemming from the sublimed dye.

The photoresist relief structures prepared therewith exhibit distinctly poorer resolution, edge steepness and fidelity of reproduction.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A process of photopatterning a substrate comprising applying a positive photoresist composition layer thereto and imagewise exposing the layer to actinic radiation, wherein the photoresist composition comprises in admixture a diazoquinone photosensitizer, a novolak resin, and an amount effective to suppress stray radiation or halation effects in photoresist coatings made therewith, of a compound of the formula

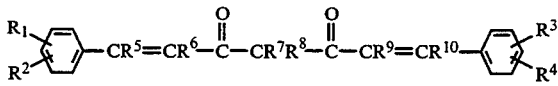

wherein $R^1$ to $R^4$ are each independently hydroxyl or $C_1$–$C_6$-alkoxy and $R^5$ to $R^{10}$ are each independently hydrogen or $C_1$–$C_6$-alkyl.

2. A process of claim 1, wherein said photoresist layer is applied to said substrate and then is preheated to a temperature of 150°–200° C.

3. A process of claim 1, wherein the substrate is a metal or semiconductor.

4. A process of claim 1, wherein said actinic radiation is of a wavelength of 350–450 nm.

* * * * *